(12) United States Patent
Lesea et al.

(10) Patent No.: US 7,795,900 B1
(45) Date of Patent: Sep. 14, 2010

(54) MEMORY ARRAY WITH MULTIPLE-EVENT-UPSET HARDENING

(75) Inventors: Austin H. Lesea, Los Gatos, CA (US); Tan C. Hoang, New Almaden, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/485,241

(22) Filed: Jun. 16, 2009
(Under 37 CFR 1.47)

(51) Int. Cl.
*H03K 19/003* (2006.01)
(52) U.S. Cl. .............................. 326/9; 326/101; 365/54
(58) Field of Classification Search .................... 326/9, 326/37–41, 101–103; 365/54, 63, 156
See application file for complete search history.

(56) References Cited

U.S. PATENT DOCUMENTS

| | | | |
|---|---|---|---|
| 5,570,313 A | 10/1996 | Masson et al. | |
| 6,573,773 B2 | 6/2003 | Maki et al. | |
| 7,139,190 B1 | 11/2006 | de Jong | |
| 7,515,452 B1 * | 4/2009 | de Jong et al. | 365/54 |

OTHER PUBLICATIONS

U.S. Appl. No. 11/649,448, filed Jan. 3, 2007, de Jong et al.
Velazco, R. et al., "Two CMOS Memory Cells Suitable for the Design of SEU-Tolerant VLSI Circuits," *IEEE Transactions on Nuclear Science*, Dec. 1994, pp. 2229-2234, vol. 41, No. 6.

* cited by examiner

*Primary Examiner*—Don P Le
(74) *Attorney, Agent, or Firm*—Scott Hewett

(57) ABSTRACT

An integrated circuit has a memory array with a four-plex of SEU-hardened memory cells. Each of the SEU-hardened memory cells has an orientation different from each of the other SEU-hardened memory cells in the four-plex, and each of the SEU-hardened memory cells has a different critical ion track. Providing a four-plex of SEU-hardened memory cells, each with a different critical ion track, reduces the probability of a single ion upsetting adjacent memory cells.

17 Claims, 7 Drawing Sheets

MEMORY ARRAY WITH MULTIPLE-EVENT-UPSET HARDENING

GOVERNMENT CONTRACT

The U.S. Government may have certain rights to this invention as provided for by the terms of AFRL Contract # FA9453-07-C-0178.

FIELD OF THE INVENTION

This invention relates generally to complementary metal-oxide-semiconductor ("CMOS") memory, and more particularly to arranging memory cells in a memory array to avoid multiple-cell upset from high energy particle hits.

BACKGROUND OF THE INVENTION

CMOS circuits are used in a variety of integrated circuit (IC) applications. A CMOS process can be used to fabricate many different sorts of functionality, such as memory, logic, and switching, and thus CMOS techniques are particularly desirable in applications where an IC includes several different types of functional blocks.

One family of ICs employing CMOS fabrication techniques are programmable logic devices (PLDs). PLDs are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these PLDs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable.

PLDs and other ICs that are specialized to be radiation tolerant are desirable for certain applications. Such ICs are often referred to as single event upset (SEU) tolerant ICs, heavy ion tolerant (HIT) ICs or radiation-hardened ICs. An SEU arises when a heavy ion or high-energy particle, such as an alpha particle or neutron, hits a memory cell, charging internal nodes of the memory cell that can change the memory state. For convenience of discussion, an SEU will be referred to as an "ion hit," whether it involves an ion or other high-energy particle causing the error.

An ion hit creates charge in the silicon of the memory cell. This charge can upset the data value stored at a node by changing the voltage at that node. As the devices used in memory cells shrink, the amount of charge required to upset a stored data value also decreases. Charge is generated about a radius of the path of the ion. Although this charge radius depends on the energy of the ion, it is generally desirable to separate redundant nodes in SEU tolerant memory cells by at least one micron.

Various approaches to improve SEU tolerance of single memory cells have been developed. One approach is commonly called "resistive hardening". Other approaches use design hardening to lay out self-recovering memory cells so that multiple node upsets are unlikely. Memory cells designed for enhanced SEU tolerance will be referred to as "SEU-hardened" cells. In other words, SEU-hardened cells are hardened by design, such as layout, cell wiring, and cell aspect ratio.

FIG. 1A is a circuit diagram of a prior art twelve-transistor SEU tolerant memory cell 150. As used herein, "twelve-transistor memory cell" refers to both the storage devices N1, N2, N3, N4, P1, P2, P3, P4 and the access devices T1, T2, T3, T4. The number of access devices is not always included in the transistor count or shown in the memory cell circuit diagram. A detailed description of a similar SEU resistant memory cell is described in U.S. Pat. No. 5,570,313 by Masson et al. A detailed description of the electrical operation of the circuit is therefore omitted.

The memory cell circuit 150 has data terminals d, $d_b$ ("data BAR"), output terminals Q, $QQ_b$, and internal nodes 152, 154 that store values $Q_b$ and QQ, respectively. A data value is a digital zero or digital one value, and the bar value is the opposite value. For example, if Q=1, then $Q_b$=0. QQ saves a redundant value of Q, and $QQ_b$ saves a redundant value of $Q_b$. The values stored at the nodes are utilized in restoring the state of the memory cell if a node is upset by an SEU.

Since QQ has the same value of Q, and $QQ_b$ has the same value of $Q_b$, other nodes could be used for the outputs of the memory cell 150. For example, instead of Q and $QQ_b$ being the nodes that are output, as shown in FIG. 1, the outputs could be nodes QQ and $QQ_b$, nodes Q and $Q_b$, or nodes QQ and $Q_b$. Furthermore, in a memory array having several similar memory cells defined in the silicon layer, some memory cells in the array may interface to other portions (circuits) of an IC through nodes Q and $Q_b$, and other memory cells may interface to other portions or the IC through nodes QQ and $Q_b$, for example.

Redundant data storage nodes are used for storing information. If data stored in one node is changed by an ion hit, the redundant node restores the other node to its initial value (state). This protects the data stored in the memory cell from ion hits as long as the data values stored in both of the redundant nodes are not simultaneously changed by an ion hit.

A general discussion of design hardening is found in the paper entitled "Two CMOS Memory Cells Suitable for the Design of SEU-Tolerant VLSI Circuits," by Velazco et al., *IEEE Transactions on Nuclear Science*, Vol. 41, No. 6 (December 1994), the disclosure of which is hereby incorporated by reference for all purposes. However, even with design hardening, it is possible for a single ion event to upset both storage bits in a memory cell if sufficient charge is transferred to (accumulated on) two node values (e.g., if QQ and QQb are simultaneously upset by a single ion hit).

As the design technology decreases for IC production, the redundant nodes of design hardened memory cells become closer together. Similarly, some applications might subject the memory cell to ultra-high-energy particles, capable of generating sufficient charge to upset not only multiple nodes of a memory cell designed for SEU hardening, but even continue into other cells, with the possibility of upsetting additional data values. Techniques have been developed to recover from a single bit upset, but become geometrically more difficult if multiple bits are simultaneously upset. A multiple-bit upset can often render a memory array useless until the true values are restored.

Therefore, SEU-hardened memory arrays that avoid multiple-cell upset from a single ion hit are desirable.

SUMMARY OF THE INVENTION

An integrated circuit has a memory array with a four-plex of SEU-hardened memory cells. Each of the SEU-hardened memory cells has an orientation different from each of the other SEU-hardened memory cells in the four-plex, and each of the SEU-hardened memory cells has a different critical ion track. Providing a four-plex of SEU-hardened memory cells, each with a different critical ion track, reduces the probability of a single ion upsetting adjacent memory cells.

DETAILED DESCRIPTION

Figure 1A:
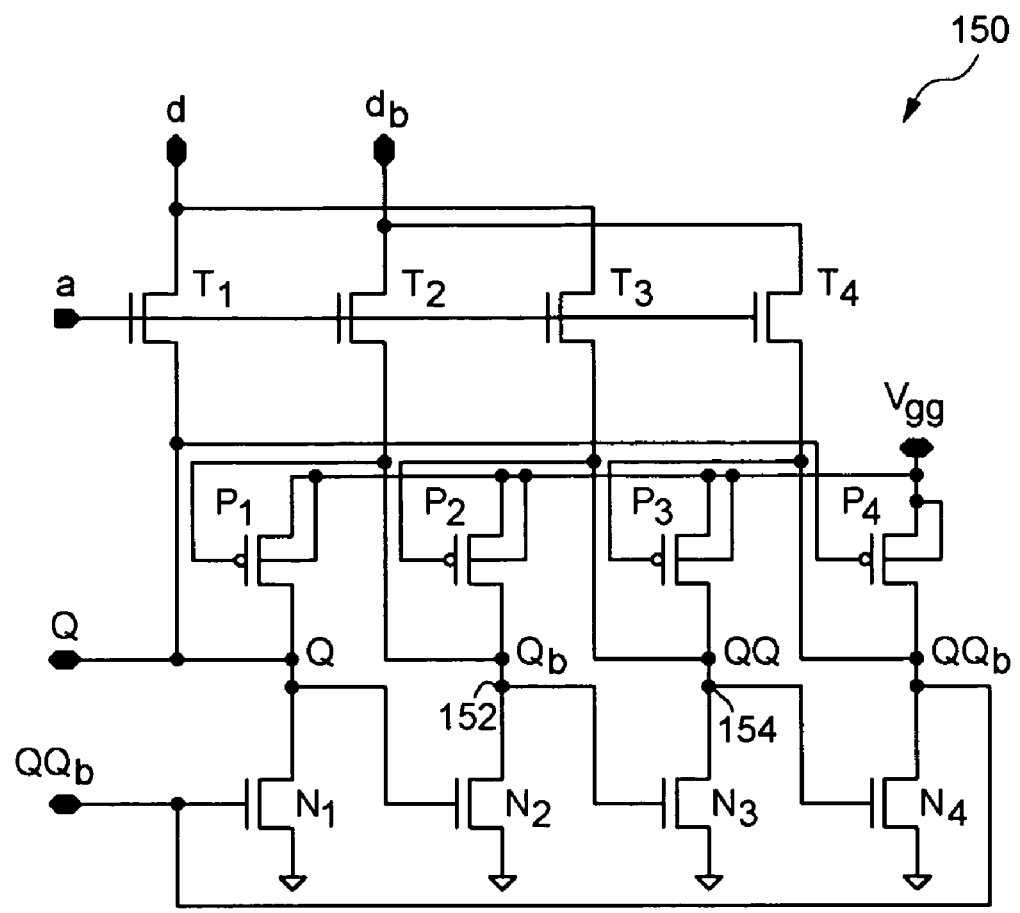
FIG. 1A is a circuit diagram of a prior art twelve-transistor SEU tolerant memory cell.
Figure 1B:
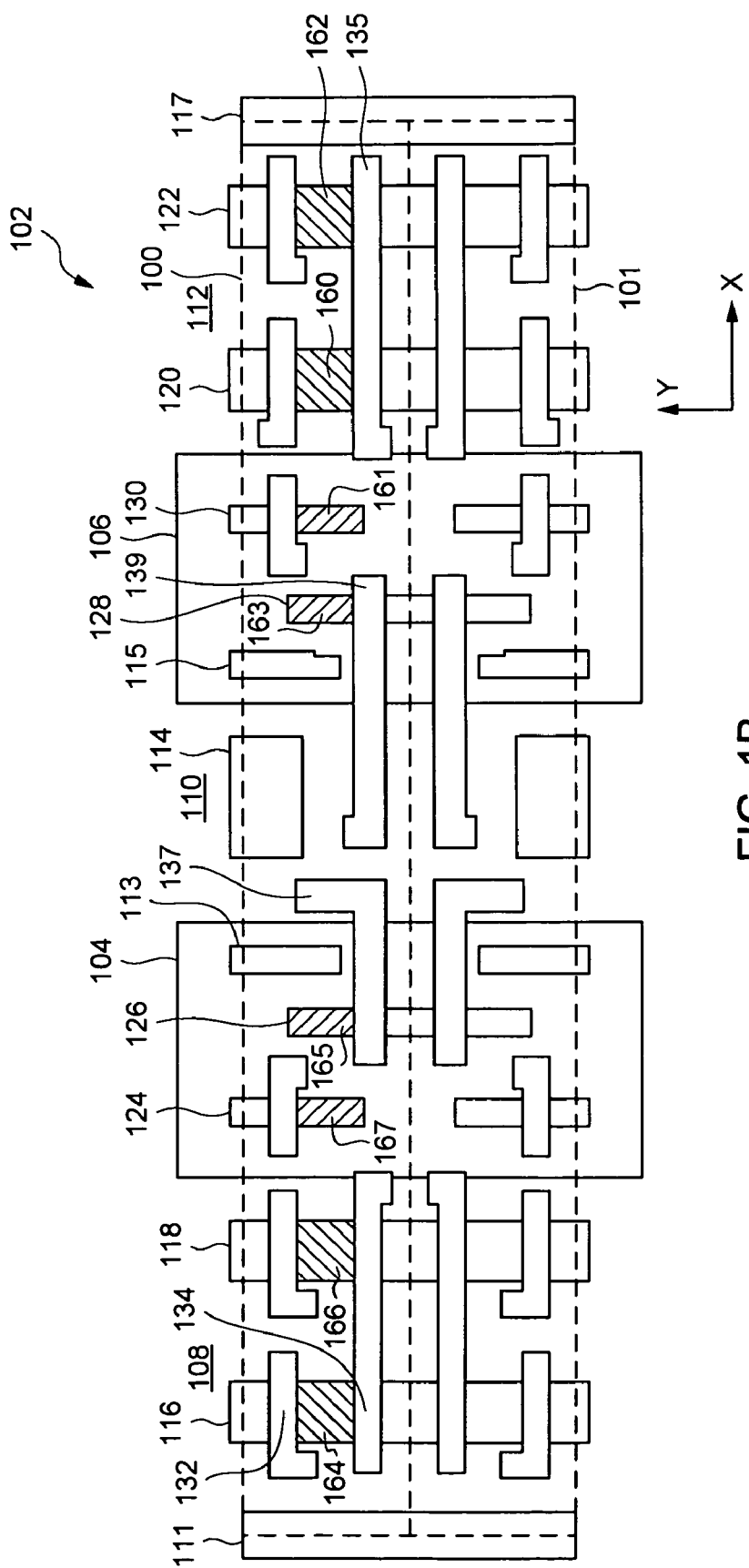
FIG. 1B is a plan view of prior art SEU-hardened memory cells suitable for embodiments of the invention.

FIG. 1B is a circuit diagram of prior art SEU-hardened memory cells 100, 101 suitable for embodiments of the invention. One memory cell 100 is within the dashed rectangle.

Another memory cell 101 that is essentially a flipped orientation of the memory cell 100 is below memory cell 100 about the X-axis of the memory array. The first and second memory cells 100, 101 form a portion of a memory cell array 102 in an IC, such as in an FPGA. In a conventional memory array, the memory cells 100, 101 are stepped in a repeated fashion to form a memory array having thousands of memory cells.

For purposes of convenient discussion and illustration, a P-type semiconductor substrate, which may optionally have a P-type epitaxial layer, having N-wells formed in it will be used in a particular example. Alternative embodiments use N-type substrates with P-wells formed in the substrate. The memory cell 100 is rectangular, which allows redundant nodes to be physically separated more than in an essentially square memory cell.

The memory cell 100 has a first N-well 104 and a second N-well 106. The memory cell 100 also has three P-type regions 108, 110, 112, that will be referred to as "P-wells", as is commonly done in the art. Thus FIG. 1A shows the memory cell 100 having, from left to right, a first P-well 108, a first N-well 104, a second P-well 110, a second N-well 106, and a third P-well 112. The terms "left", "right", "first", "second", and "third" are arbitrarily chosen for purposes of convenient discussion, and are not limiting. As used herein, the term "well" includes not only conventional wells formed in a silicon wafer or similar substrate, but also well-like structures formed on silicon-on-insulator ("SOI") substrates, for example.

The memory cell 100 includes N-diffusions 116, 118, 120, 122 and P-diffusions 124, 126, 128, 130 for the p-type and n-type transistors used in the memory cell. Gate structures, such as gate structure 132, are polysilicon, silicide, or other material, and form a channel region in the diffusion 116, as is well known in the art. Since gate structures are very well known to those of ordinary skill in the art, not all gate structures are identified with a reference numeral in order to simplify and clarify the illustration. Similarly, contacts are not shown to improve the clarity of illustration, as contacts to gate structures, taps, wells, and other features are well known, and a variety of contact placements is possible. It is commonly understood that an FET has a gate contact, a source contact, and a drain contact (e.g. gate structure 132 would have a contact, and the associated diffusion 116 would have contacts ("source/drain" contacts also known as "diffusion contacts", see FIG. 5B, on either side of the gate structure 132). Whether a source/drain contact operates as a source or as a drain depends on the electrical connections made to the physical device. Calling such contacts "source/drain contacts" is well understood in the art.

N-diffusion 116 is crossed by a first gate structure 132 and a second gate structure 134, which allows the formation of two FETs using a common diffusion. Note also that the second gate structure 134 also crosses N-diffusion 118. Thus, the gate structure 134 is used for two FETs. Using a common diffusion for multiple FETs reduces the physical size (area) of the memory cell and provides a twelve-transistor SEU-hardened memory cell having a short height (y-direction).

The memory cell 100 also has N-tap diffusions ("N-taps") 113, 115, and the P-tap diffusions ("P-taps") 111, 114, 117. Gate structures 134, 135 form access transistors and gate structure 139 forms a PMOS transistor, for example. The high aspect ratio of the memory cell layout allows the gate structures 137, 139 to be extended to facilitate connections between half cells (see FIGS. 5A-5E, illustrating patterned metal layers electrically connecting the memory cell devices). For example, the "L" shape of gate structure 137 moves the contact position above gate structure 139 so that contacts and metal traces above the gate structures 137, 139 do not interfere.

The memory cell 100 has P-taps 111, 114, 117 on both sides of each N-well 104, 106. The taps provide current paths for charge generated by ion hits, and are biased to form a P-N junction between the N-wells 104, 106 and the substrate/P-wells 108, 110, 112. In a particular embodiment, the P-taps are grounded, and the N-taps are biased to a supply voltage level (Vgg). An ion generates charge as it travels through the semiconductor material. An ion hitting an N-well would generate charge in the N-well material, as well as possibly in the semiconductor material (substrate) below the N-well.

However, the P-N junction between the N-well and the underlying P-type substrate inhibits ion-generated charge flow from the substrate into the N-well. In the P-wells 108, 110, 112, the charge generated by an ion hit is not blocked, thus the NMOS devices in the P-wells are more susceptible to being upset from an ion hit than are the PMOS devices in the N-wells, and it is desirable to separate the NMOS devices further apart to provide SEU tolerance. In an embodiment having P-wells formed in an N-type substrate, it would be desirable to provide further separation between the PMOS devices than the NMOS devices for similar reasons.

Using multiple diffusions 116, 118 in the P-well 108 reduces the node target areas 164, 166, indicated by hatching on the diffusions 116, 118. The node target areas are the portions of the diffusion areas connected to a node, and are the portions of the diffusion areas most susceptible to an ion hit upsetting a data value at the node. Node target areas 160, 162 in the P-well 112 and node target areas 161, 163, 165, and 167 in N-wells 106 and 104, respectively, are also shown. It is particularly desirable to keep redundant node target areas physically separated and electrically isolated to provide SEU tolerance. Additional description of the memory cell 100 is provided in commonly owned U.S. patent application Ser. No. 11/649,448, entitled MEMORY CELL WITH SINGLE-EVENT-UPSET TOLERANCE, filed Jan. 3, 2007, by Jan L. de Jong, Susan X. Nguyen, and Raymond C. Pang, the disclosure of which is hereby incorporated in its entirety for all purposes.

Figure 1C:
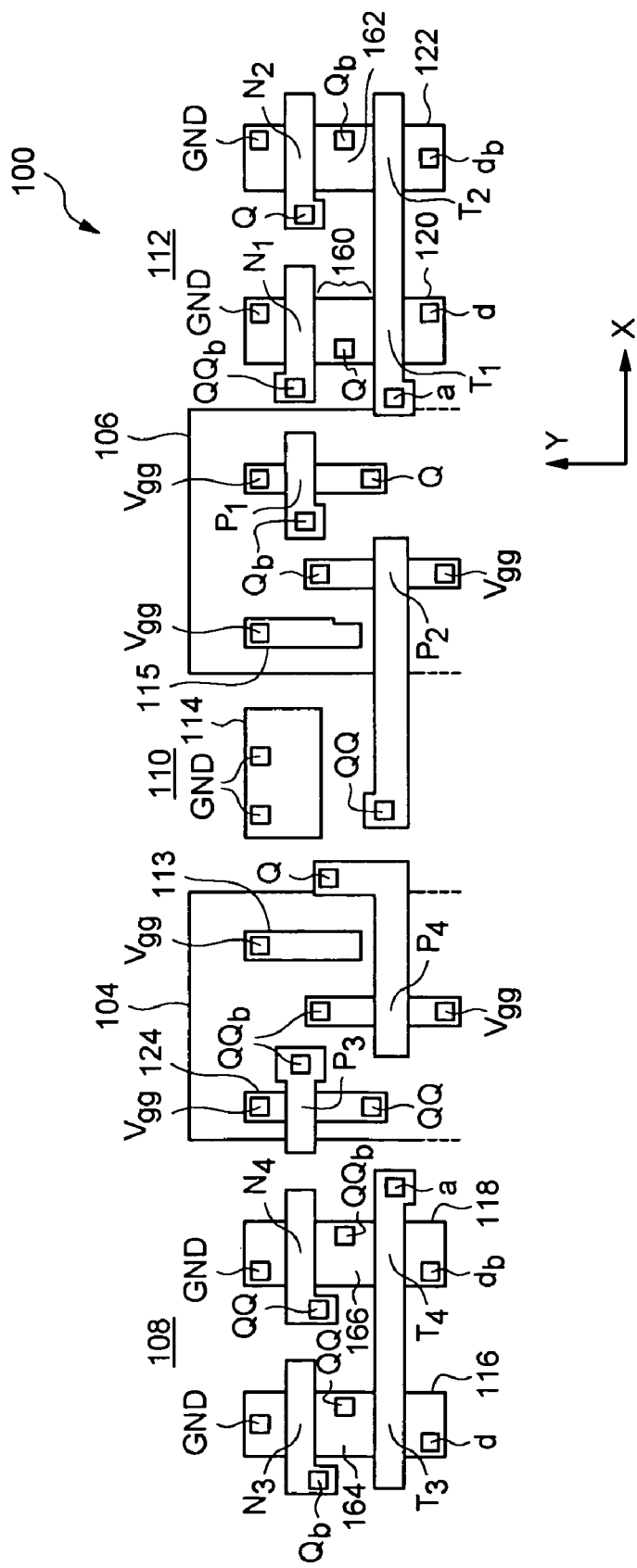
FIG. 1C is a plan view of a memory cell 100 of FIG. 1B with indicators corresponding to the circuit diagram of FIG. 1A.

FIG. 1C is a plan view of a memory cell 100 of FIG. 1B with indicators corresponding to the circuit diagram of FIG. 1A. FIG. 1C is only one of various ways the memory cell 100 could be wired. The memory cell 100 has a plurality of transistors connected so as to restore a data value to a node of the memory cell to an initial value following an event upsetting the initial value, the plurality of transistors including at least a first storage transistor of a first type (e.g. N3) in a first diffusion (e.g. 116) in a first well of a first type (e.g. 108), a second storage transistor of the first type (e.g. N4) in a second diffusion (e.g. 118) in the first well of the first type, a third storage transistor of the first type (e.g. N1) in a third diffusion (e.g. 120) in a second well of the first type (e.g. 112), a fourth storage transistor of the first type (e.g. N2) in a fourth diffusion (e.g. 122) in the second well of the first type; and first, second, third, and fourth transistors of a second type (P1, P2, P3, P4) formed in at least a first well of a second type (104, 106), the first well of the second type being disposed between the first well of the first type and the second well of the first type along the long dimension (X) of the memory cell.

Referring to the description of FIG. 1A describing operation of an SEU resistant memory cell circuit, storage transistors N1 and N2 in FIG. 1C are in P-well 112, while storage transistors N3 and N4 are in P-well 108. Two N-wells 104, 106, and a P-well 110 are between storage transistors N1, N2 and storage transistors N3, N4. The N-wells 104, 106 include taps 113, 115, and the center P-well 110 includes tap 114. The taps for P-wells 108 and 112 are not shown in this view (see FIG. 1B, ref. nums. 111, 117). It is desirable to physically separate source/drain diffusion areas 116 and 122 and diffusion areas 118 and 120 to provide SEU resistance so that an ion hit to the memory cell 100, does not simultaneously affect the values at the node pairs Q-QQ or $Q_b$-$QQ_b$ (i.e., target area pair 160 and 164, and target area pair 162 and 166 in FIG. 1B. In an alternative embodiment, N2 is paired with N3, and N1 is paired with N4).

Similarly, PMOS storage device P3 is separated from P2, and P4 is separated from P1. Separating the source/drain diffusion areas of P-type storage devices associated with logic value restoration is desirable to avoid a single ion hitting, and thus upsetting, P1 and P4, or P2 and P3, simultaneously. It is desirable to provide greater separation between N-type storage FETs (e.g. N1 and N4) in a P-type substrate because charge generated in the substrate has a free path back to the P-wells whereas the N-wells are isolated from the substrate by appropriate bias voltages forming a junction between the N-well and substrate. In FIG. 1C, contacts are shown as small squares, and electrical connections to the contacts are indicated according to the labeling of the circuit diagram of FIG. 1A.

Figure 2:
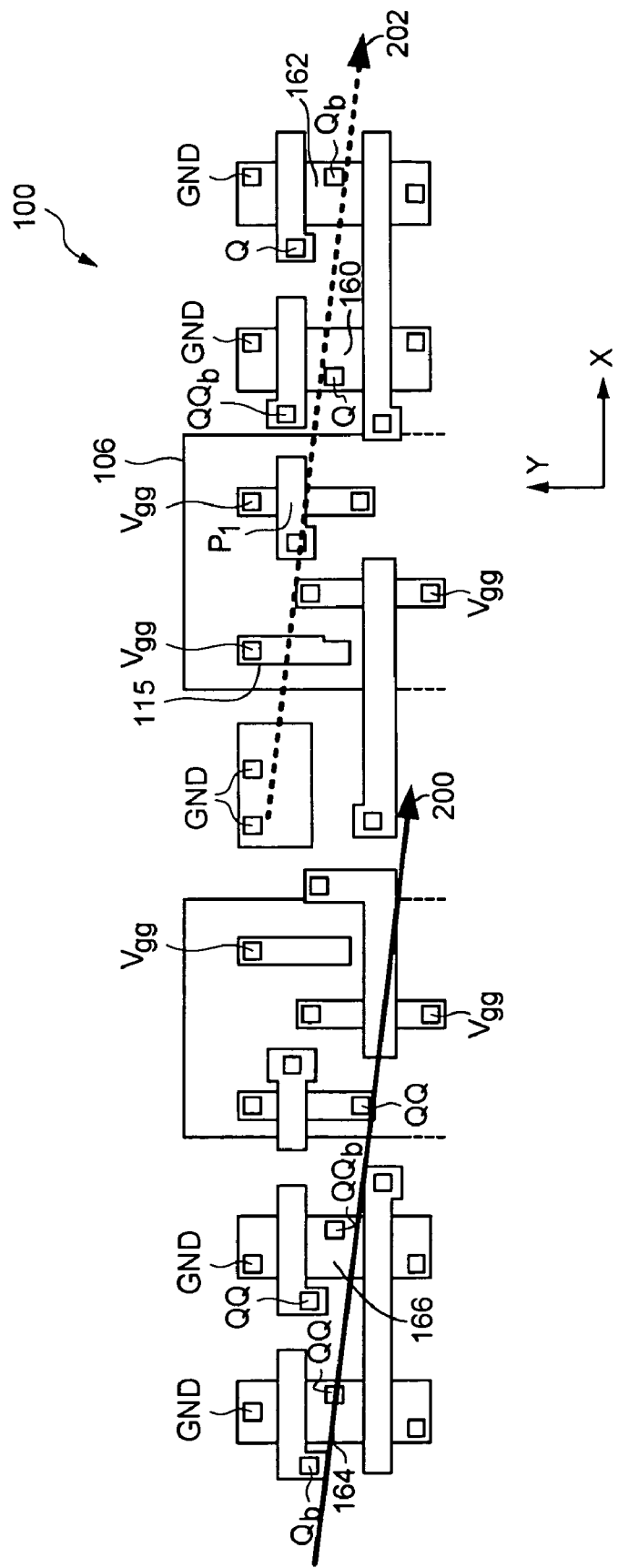
FIG. 2 is a plan view of a memory cell of FIG. 1B with indicators corresponding to the circuit diagram of FIG. 1A and a critical beam angle according to an embodiment.

FIG. 2 is a plan view of a memory cell of FIG. 1B with indicators corresponding to the circuit diagram of FIG. 1A and an ion track, 200 according to an embodiment. The critical angle is the angle at which a high-energy particle has the highest probability of causing an upset event in the memory cell 100. Such a particle has sufficient energy to create charge that is transferred to or accumulated on at least two nodes of the SEU-hardened memory cell 100 and to cause the data state of the SEU-hardened memory cell to become invalid.

Figure 3A:
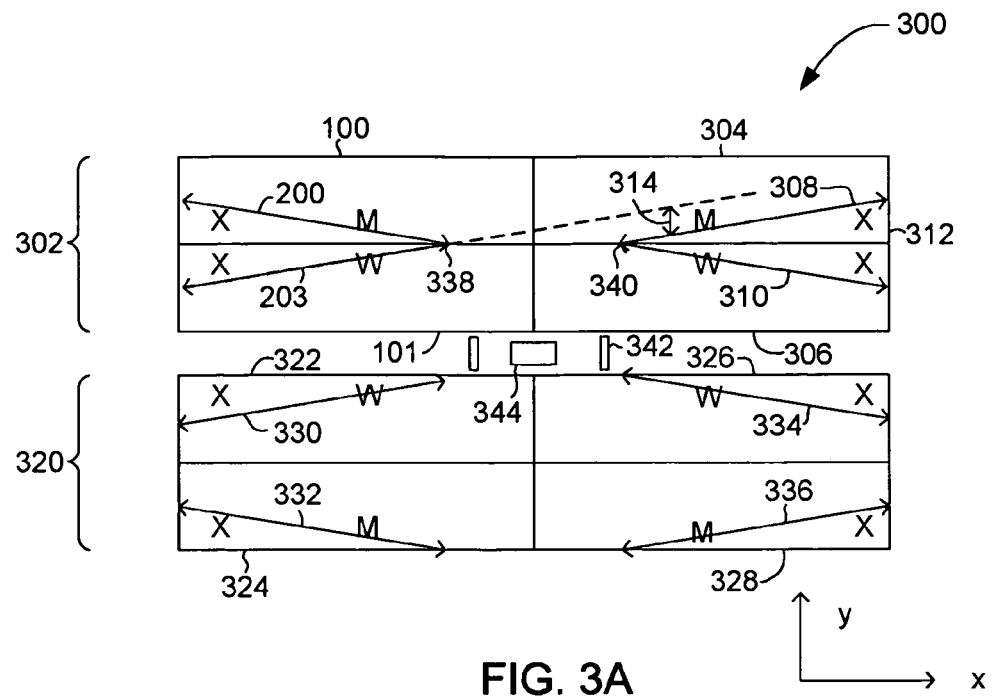
FIG. 3A is a plan view of a portion of a memory array according to an embodiment.
Figure 3B:
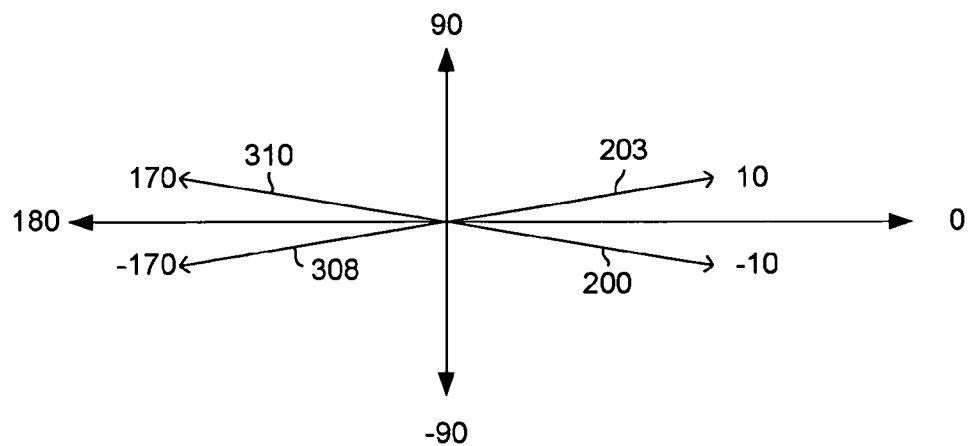
FIG. 3B is an illustration of critical ion tracks in the four-plex of FIG. 3A.

In this example, the critical ion track is measured with respect to the X-axis according to the convention illustrated in FIG. 3B, namely, the critical angles are designated in reference to plus or minus 180 degrees from the X-axis. Those of skill in the art will appreciate that another reference (e.g., the Y-axis) could be used, and another convention (e.g., from zero degrees to 360 degrees). The convention and terminology used below is only for purposes of convenient discussion. The axes of a memory array are generally the directions along which the memory cells or blocks of memory cells are stepped and repeated.

Although a casual viewer, looking at FIG. 1B, might conclude that the critical angle would be 180 degrees, this was found to not be the case. Computer simulations were performed that determined the critical angles for various cell orientations did not occur at 180 degrees, but for a particular embodiment (namely, a rectangular cell in accordance with FIG. 1B having an aspect ratio of about 5:1), the critical angle occurred at an angle of about −10 degrees from the X-axis. The critical ion track 200 shown in FIG. 2 is only for purposes of illustration. This result was confirmed on physical devices. It is expected that the critical angle will vary for different memory cells, depending on layout, aspect ratio, cell wiring, cell biasing, and other factors, such as the data state of the memory cell.

In an FPGA according to an embodiment, a zero data state is more common than a one data state in an SEU-hardened memory array. In a particular embodiment, the ratio of memory cells storing a zero to memory cells storing a one is about 9:1. Thus, an SEU-hardened memory cell that is more difficult to flip from a zero to a one is preferred to the opposite case. In a particular embodiment, memory cells having an asymmetric response from an upset event, namely that change from a zero to one is more difficult than change from one to zero, are used in the memory array of an FPGA.

Generally, the critical ion track for a memory cell passes through at least two critical node target areas, such as node target area 164, which in this example stores the value QQ, and node target area 166, which stores the value QQb. The direction of travel along an ion track is essentially reciprocal. In other words, an ion travelling along the ion track 200 from left to right (as represented by the arrowhead on ion track 200) or from right to left could upset the memory cell. The arrowhead is included on ion track 200 to indicate that a single ion particle travelling along the ion track does not change direction, but continues along the direction of motion.

The critical angle is influenced by a variety of factors not immediately appreciated by casual observation. For example, an ionized particle will be attracted to an opposite charge and repelled by a like charge, so conductive features of the cell, such as diffusions, contacts, well taps, and vias, that are connected to a voltage reference, such as ground or Vgg, will affect whether the data state of the SEU-hardened memory cell is upset. Charge generated by an ion hit can be sunk or sourced to the respective voltage reference(s) through the conductive elements. This affects whether the generated charge will be sufficient to upset multiple nodes and cause a data upset.

Consider, for example, an ion track 202 at the same angle that impinges on the right-half portion of the memory cell 100. The ion track 202 passes through the node target area 160 (storing the value Q) and the node target area 162 (storing the value $Q_b$). However, the ion track 202 is offset in space from the ion track 200 first travels through the ground tap for the center P-well, N-well tap 115, the N-well 106, and the Vgg terminal of P1, all of which will draw some charge and sink or source it to the respective voltage reference, before reaching the node target areas 160, 162, and provide a very different macro-environment for an ion travelling along track 202 than an ion travelling along track 200. The ion track 202 is not the critical ion track for the right-hand half of the memory cell.

Although the memory cell 100 has a high degree of symmetry regarding the diffusions and wells, differences in the macro-environment encountered by a high-energy ion results in a critical ion track that does not lie along (parallel to) an axis of the memory cell or memory array. In other words, the critical ion track for the right half of the memory cell 100 is different than for the left half. If the memory cell (not shown, see FIG. 3A) in the next adjacent column is flipped about a vertical axis (Y-axis) compared to the memory cell 100, the critical ion track for the adjacent cell is different, even though the cells are flipped orientations of each other about the X-axis and Y-axis of the memory array. This reduces the possibility of a single high-energy ion upsetting adjacent memory cells.

FIG. 3A is a plan view of a portion of a memory array 300 according to an embodiment. The memory array has a four-plex 302 of SEU-hardened memory cells 100, 101, 304, 306 with respective critical ion tracks of 200, 203, 308, 310. The four-plex 302 includes two cells 100, 101 in a first column in adjacent first and second rows of the memory array 300 and two more cells 304, 306 in a second column adjacent to the first column in the same adjacent rows as the first two cells. Each cell in the four-plex has a different orientation (referenced by a reference corner, X, and midpoint, M (which becomes "W" when flipped upside down)) and each cell has a different critical ion track. That is, a critical ion track in one cell (which can extend for several cell dimensions within the memory array) is offset from or a different angle from the critical ion track of each adjacent cell. In a particular embodiment, the angles of the critical ion tracks are about −10 degrees, 10 degrees, −170 degrees, and 170 degrees from the X-axis of the memory array 300 (see, FIG. 3B). Other SEU-hardened memory cells designs are expected to have other critical angles, and the critical angles determined above are merely exemplary for a particular cell design in a 65 nm node technology.

The orientation of the second memory cell 101 is flipped from the orientation of the first memory cell 100 about the X-axis 333. The third 304 and fourth 306 memory cell in the four-plex 302 are flipped about the Y-axis 335 from the first two memory cells 100, 101 (Alternatively, the third cell 304 is flipped about the Y-axis from the first cell 100, and the fourth cell 306 is flipped about the X-axis from the third cell to obtain the same four-plex of memory cells). This gives each SEU-hardened memory cell in the four-plex 302 a different critical ion track, either offset from or at a different angle from each other ion track in the four-plex. Although the second critical ion track 203 is parallel to the third critical ion track 308, as shown by the dashed line 312, there is an offset 314 between them, and thus the critical ion track 203 for memory cell 101 is not the critical ion track for memory cell 304. An ion travelling along path 203 would not be expected to upset the data value of memory cell 306, or memory cell 304. Furthermore, if another memory cell (not shown) adjacent to cell 304 had the same layout and critical angle as cell 101 (i.e., the four-plex 302 was replicated to the right), the ion track 203 would not be expected to disrupt that adjacent cell because the ion track would be offset from (above) the critical ion track in the adjacent cell.

The memory array 300 includes a second four-plex 320 of SEU-hardened memory cells 322, 324, 326, 328 each with four different critical ion tracks 330, 332, 334, 336. The upper left memory cell 322 in the second four-plex 320 is flipped about the X-axis from the upper left memory cell 100 in the first four-plex 302. "Flipping" about an axis is a term commonly used to describe manipulation of images in computer drawing programs.

The initial orientation and flipping results in the first and second critical ion tracks 200, 203 intersecting 388 at the X-axis of the memory array between the first and second SEU-hardened memory cells 100, 101. The third and fourth critical ion tracks 308, 310 also intersect 340 at the X-axis of the memory array between the third and fourth SEU-hardened memory cells 304, 306. The critical ion tracks in the second four-plex 320 do not intersect in that fashion because the orientation of the first cell was different than the orientation of the first cell in the first four-plex 302. The designation of the "first" cell in a four-plex is arbitrary; however, by choosing different orientations for whichever cell in the four-plex is designated as "first", four-plexes having very different patterns of critical ion tracks are obtained. In a particular embodiment, well taps 342, 344 between the first and second four-plexes of memory cells 302, 320 operate as current sinks that drain charge created by ions that impinge the wells or diffusions associated with the well taps 342, 344.

FIG. 3B is an illustration of critical ion tracks 200, 203, 308, 310 in the four-plex 302 of FIG. 3A. For purposes of discussion, co-linear or parallel vectors extending in opposite directions will be referred to as reciprocal vectors, and vectors that add to 180 degrees will be referred to as complementary vectors. The four critical ion tracks in the second four-plex 320 would similarly extend from the origin.

Referring to FIG. 1B, the diffusions 116, 118, 120, 122 lie along columns of the memory array and are shared by the upper and lower cells. As noted above, the diffusions and wells of each memory cell are highly symmetrical, which might lead a casual observer to believe that the critical ion track lies parallel to the X-axis; however, contacts, vias, gates, and other structures have less symmetry and affect the critical ion track so that it does not lie along an axis of the memory array, but rather typically between about 155 (25) degrees and about 170 (10) degrees. Referring now to FIG. 3A in view of FIG. 1B, when the second, third, and fourth memory cells 101, 304, 306 are flipped to orientations different from the first memory cell 100, the (e.g. the diffusions 116, 118, 120, 122 and wells 104, 106 and their counterparts in the other memory cells, which are omitted from FIG. 3B for clarity of illustration) remain aligned in a columnar fashion along the Y-axis of the memory array. This is desirable when laying out a memory array because such alignment provides easier, more consistent fabrication.

Figure 4:
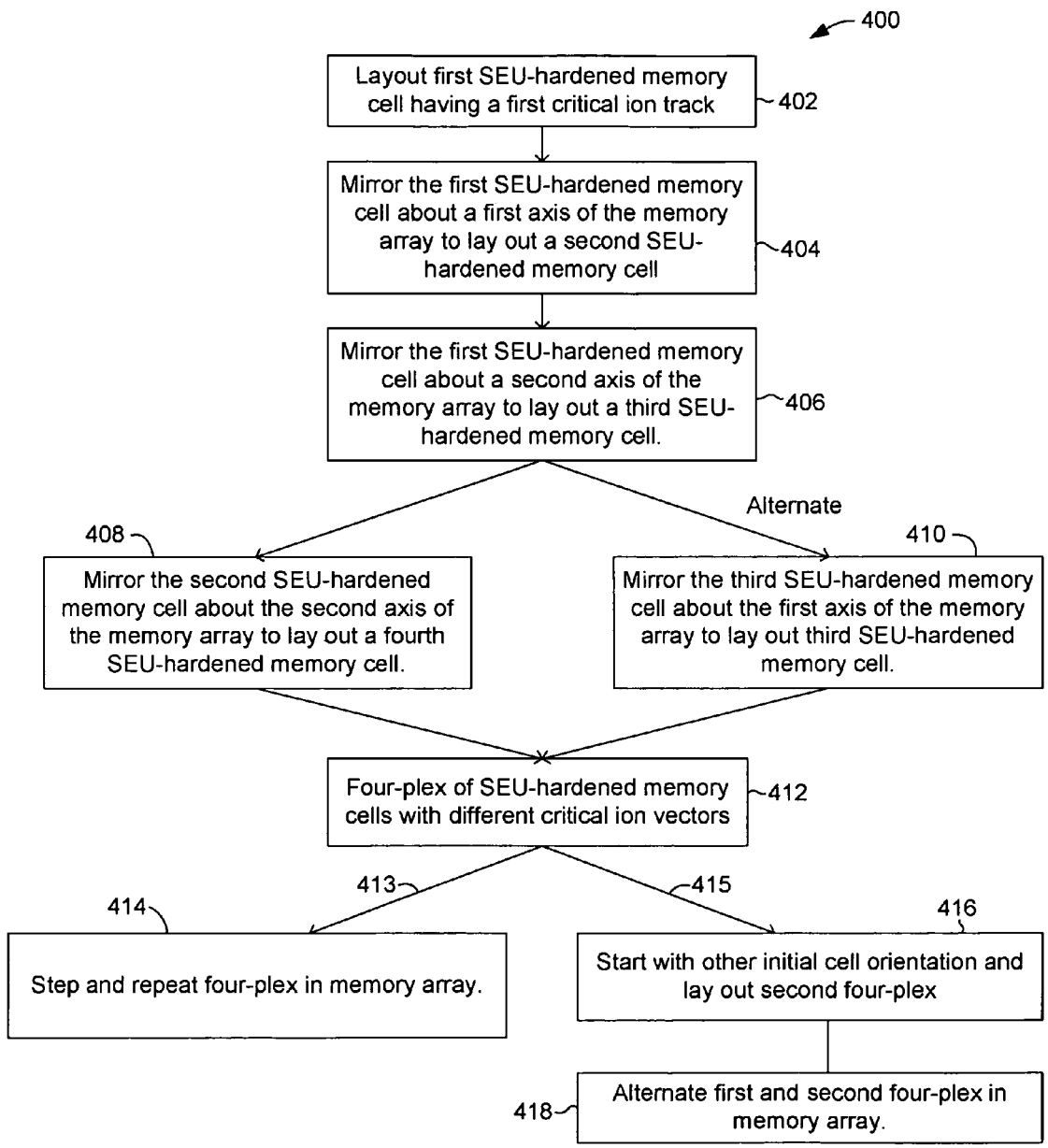
FIG. 4 is a flow chart of a method of designing an SEU-hardened memory array according to an embodiment

FIG. 4 is a flow chart of a method of designing 400 an SEU-hardened memory array according to an embodiment. A first SEU-hardened memory cell having a first critical ion track is laid out (step 402). The first SEU-hardened memory cell layout is flipped about a first axis of the memory array to lay-out a second SEU-hardened memory cell adjacent to the first SEU-hardened memory cell having a second critical ion track (step 404). The first SEU-hardened memory cell is flipped about a second axis of the memory array to lay-out a third SEU-hardened memory cell adjacent to the first SEU-hardened memory cell having a third critical ion track (step 406), and the second SEU-hardened memory cell is flipped about the second axis of the memory array to lay-out a fourth SEU-hardened memory cell adjacent to the second SEU-hardened memory cell and to the third SEU-hardened memory cell having a fourth critical ion track (step 408). Alternatively, the fourth SEU-hardened memory cell is laid-out by flipping the third SEU-hardened memory cell about the first axis of the memory array, or a duplex of cells (i.e., two adjacent cells in a column or two adjacent cells in a row) is flipped about an axis (e.g., Y-axis or X-axis) to obtain the desired layouts of the other two cells of the four-plex.

In a particular embodiment (branch 413), steps 402 through 408 form a first four-plex of SEU-hardened memory cells (step 412). In a further embodiment, the first four-plex of SEU-hardened memory cells is stepped and repeated (step 414) to form the memory array. In an alternative embodiment (branch 415), a second four-plex of SEU-hardened memory cells is laid out by flipping the first SEU-hardened memory cell about the X-axis or the Y-axis to start with a different initial cell orientation and flipping that cell about both axis and defining the opposite corner cell by flipping either of the adjacent cells to form a second four-plex different from the first four-plex (step 416), and the first and second four-plexes are stepped and repeated in an alternating fashion (step 418) to lay out the memory array.

Figure 5:
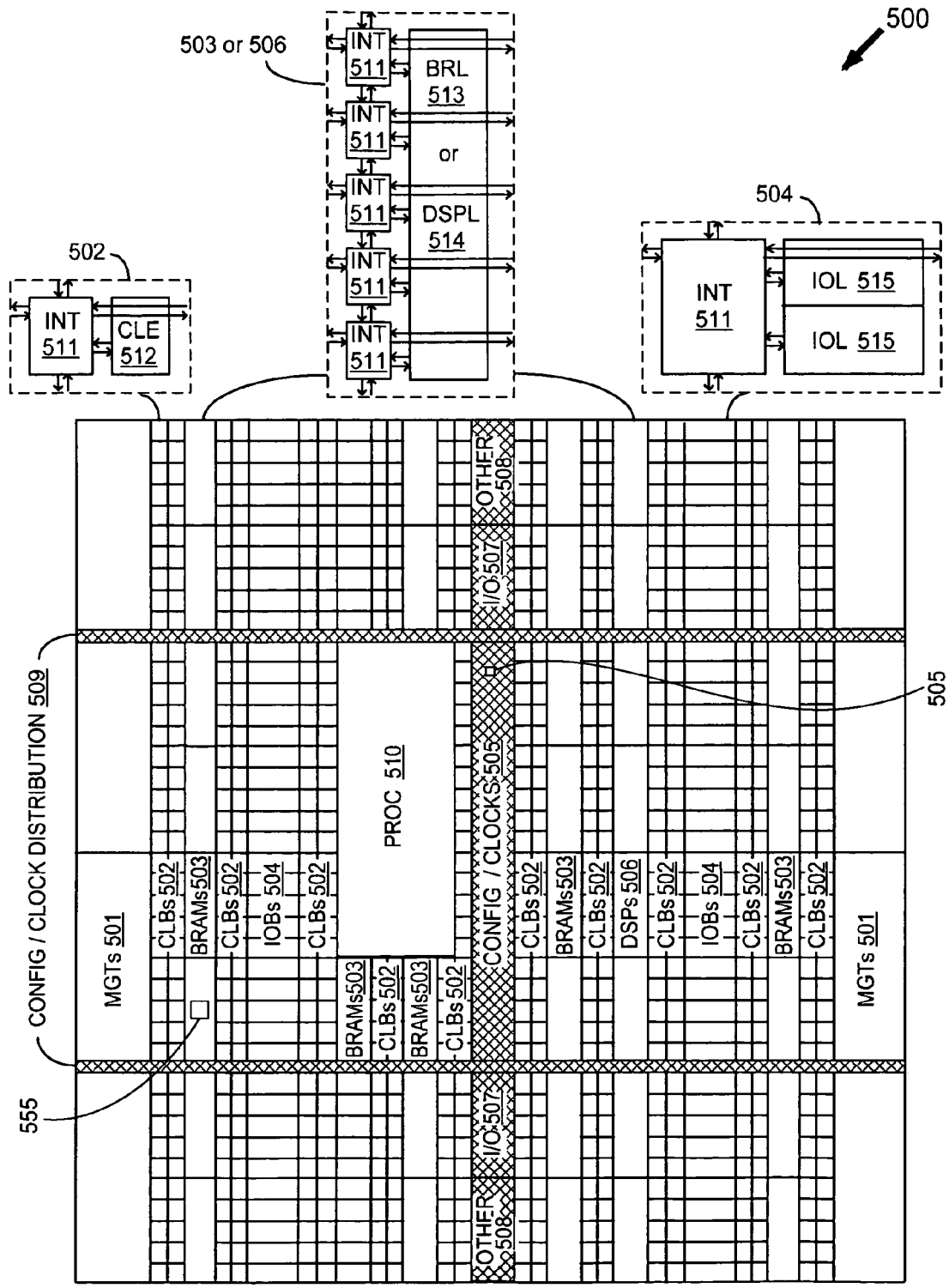
FIG. 5 is a plan view of an FPGA with an SEU-hardened memory array according to an embodiment.

FIG. 5 is a plan view of a floorplan of an FPGA with an SEU-hardened memory array according to an embodiment. The FPGA architecture 500 includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507) (e.g., configuration ports and clock ports), and other programmable logic 508 such as digital clock managers, analog-to-digital converters, system monitoring logic, and so forth. Some FPGAs also include dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element (INT 511) also includes the connections to and from the programmable logic element within the same tile, as shown by the examples included at the top of FIG. 5.

For example, a CLB 502 can include a configurable logic element (CLE 512) that can be programmed to implement user logic plus a single programmable interconnect element (INT 511). A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 506 can include a DSP logic element (DSPL 514) in addition to an appropriate number of programmable interconnect elements. An 10B 504 can include, for example, two instances of an input/output logic element (IOL 515) in addition to one instance of the programmable interconnect element (INT 511). As will be clear to those of skill in the art, the actual I/O pads connected, for example, to the I/O logic element 515 are manufactured using metal layered above the various illustrated logic blocks, and typically are not confined to the area of the input/output logic element 515.

In the pictured embodiment, a columnar area near the center of the die (shown shaded in FIG. 5) is used for configuration, clock, and other control logic. Horizontal areas 509 extending from this column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic.

Embodiments of the invention are incorporated in any of several portions of the FPGA 500. For example, SEU-hardened arrays 505, 555 according to one or more embodiments are incorporated in BRAMs or configuration memory. Configuration memory is distributed throughout an FPGA and is generally present in numerous types of programmable blocks, such as CLBs and IOs. Some types of memory, such as block memory, use error code correction techniques, and are less susceptible to SEU errors.

The configuration memory cells in an FPGA are used to control the operation of other circuits. Within the FPGA, the memory cells are placed in columns, where there could be groups of 1, 2, or 3 columns separated by circuits controlled by the memory cells. Memory cell outputs can connect to the circuits using poly or metal layers. Embodiments of the invention are particularly effective in FPGAs because blocks of memory are interspersed with other types of circuitry, such as logic blocks.

Configuration memory is particularly susceptible to SEU because error code correction techniques cannot be used, and an error in configuration memory can change the functionality of a block in the FPGA. In a particular embodiment, the FPGA 500 is fabricated using a technology design less than 90 nm. It is particularly challenging to provide SEU tolerant memory for small technology designs because as the design technology decreases, the separation between nodes of a memory cell decreases. The amount of charge needed to upset a data value stored at a node also typically decreases. Memory cell layouts with high aspect ratios have sufficient separation between redundant nodes to provide high SEU tolerance, even in small technology designs.

While the present invention has been described in connection with specific embodiments, variations of these embodiments will be obvious to those of ordinary skill in the art. Therefore, the spirit and scope of the appended claims should not be limited to the foregoing description.

What is claimed is:

1. An integrated circuit having a memory array comprising:
   a first single-event upset ("SEU")-hardened memory cell in a first row and a first column of the memory array having a first orientation and a first critical ion track;
   a second SEU-hardened memory cell adjacent to the first SEU-hardened memory cell and having a second orientation, the second orientation being a first flipped image of the first orientation about a first axis of the memory array between the first SEU-hardened memory cell and the second SEU-hardened memory cell and having a second critical ion track;
   a third SEU-hardened memory cell adjacent to the first SEU-hardened memory cell and having a third orientation, the third orientation being a second flipped image of the first orientation about a second axis of the memory array between the first SEU-hardened memory cell and the third SEU-hardened memory cell and having a third critical ion track; and
   a fourth SEU-hardened memory cell adjacent to the second SEU-hardened memory cell having a fourth orientation being a flipped image of the second orientation about the second axis and having a fourth critical ion track, wherein each of the first critical ion track, the second critical track, the third critical ion track and the fourth critical ion track are different from each other.

2. The integrated circuit of claim 1 wherein the first SEU-hardened memory cell, the second SEU-hardened memory cell, the third SEU-hardened memory cell, and the fourth SEU-hardened memory cell form a first four-plex of SEU-hardened memory cells.

3. The integrated circuit of claim 2 wherein the first four-plex of SEU-hardened memory cells is in a configuration memory of a field-programmable gate array.

4. The integrated circuit of claim 1 wherein none of the first critical ion track, the second critical ion track, the third critical ion track and the fourth critical ion track are parallel to the first axis of the memory array or to the second axis of the memory array.

5. The integrated circuit of claim 1 wherein the first critical ion track is at a first angle from the first axis of the memory array and the fourth critical ion track is parallel to and offset from the first critical ion track.

6. The integrated circuit of claim 5 wherein the second critical ion track is at a second angle from the first axis of the memory array and the third critical ion track is parallel to and offset from the second critical ion track.

7. The integrated circuit of claim 6 wherein a sum of the first angle and the second angle is one hundred and eighty degrees.

8. The integrated circuit of claim 6 wherein the first critical ion track is at a 170 degree or a minus 10 degree angle from the first axis of the memory array and the second critical ion track as at a 10 degree or a minus 170 degree angle from the first axis of the memory array.

9. The integrated circuit of claim 2 further comprising a second four-plex of SEU-hardened memory cells, the second four-plex having a fifth SEU-hardened memory cell having the second orientation and a fifth critical ion track, a sixth SEU-hardened memory cell having the first orientation and a sixth critical ion track, the sixth SEU-hardened memory cell being a first flipped image of and adjacent to the fifth SEU-hardened memory cell about the first axis of the memory array, a seventh SEU-hardened memory cell having the fourth orientation and a seventh critical ion track, the seventh SEU-hardened memory cell being a second flipped image of and adjacent to the fifth SEU-hardened memory cell about the second axis of the memory array, and an eighth SEU-hardened memory cell having the third orientation and an eighth critical ion track, the eighth SEU-hardened memory cell being adjacent to the sixth SEU-hardened memory cell along the first axis of the memory array and adjacent to the seventh SEU-hardened memory cell along the second axis of the memory array.

10. The integrated circuit of claim 9 wherein the first critical ion track intersects the second critical ion track at the first axis of the memory array and wherein the fifth critical ion track does not intersect the sixth critical ion track at the first axis of the memory array.

11. A method of laying out a memory array in an integrated circuit ("IC") comprising:
    laying out a first SEU-hardened memory cell having a first orientation with a first critical ion track;
    laying out a second SEU-hardened memory cell in the memory array of the IC adjacent to the first SEU-hardened memory cell along a first axis of the memory array having a second orientation being a first flipped image of the first orientation;
    laying out a third SEU-hardened memory cell in the memory array of the IC adjacent to the first SEU-hardened memory cell along a second axis of the memory array having a third orientation being a second flipped image of the first orientation; and
    laying out a fourth SEU-hardened memory cell adjacent to the second SEU-hardened memory cell along the second axis of the memory array and adjacent to the third SEU-hardened memory cell along the first axis of the memory array having a fourth orientation to form a first four-plex of SEU-hardened memory cells, each memory cell in the first four-plex of SEU-hardened memory cells having an orientation different from each of the other SEU-hardened memory cells in the first four-plex of SEU-hardened memory cells.

12. The method of claim 11 further comprising:
    stepping and repeating the first four-plex of SEU-hardened memory cells to lay out the memory array.

13. The method of claim 11 further comprising:
    laying out a second four-plex of SEU-hardened memory cells, each memory cell in the second four-plex of SEU-hardened memory cells having an orientation different from each of the other SEU-hardened memory cells in the second four-plex of SEU-hardened memory cells, the second four-plex of memory cells being adjacent to the first four-plex of memory cells; and alternating the first four-plex of memory cells with the second four-plex of memory cells to lay out the memory array.

14. The method of claim 11 wherein the first four-plex of memory cells is laid out in a configuration memory of a field-programmable gate array.

15. The method of claim 11 wherein the first SEU-immune memory cell and the second SEU-immune memory cell are laid out so as to have a first common diffusion area extending along the second axis of the memory array.

16. The method of claim 15 further comprising
laying out a second four-plex of SEU-hardened memory cells adjacent to the first four-plex of SEU-hardened memory cells in a column of the memory array; and
laying out a well tap between the first four-plex of SEU-hardened memory cells and the second four-plex of SEU-hardened memory cells.

17. The method of claim 16 wherein the step of laying out the second four-plex of SEU-hardened memory cells includes laying out a second common diffusion area aligned with the first common diffusion area along the second axis of the memory array.

* * * * *

UNITED STATES PATENT AND TRADEMARK OFFICE
CERTIFICATE OF CORRECTION

| | |
|---|---|
| PATENT NO. | : 7,795,900 B1 |
| APPLICATION NO. | : 12/485241 |
| DATED | : September 14, 2010 |
| INVENTOR(S) | : Lesea et al. |

It is certified that error appears in the above-identified patent and that said Letters Patent is hereby corrected as shown below:

In the Specification

Column 1, lines 6-8, replace "The U.S. Government may have certain rights to this invention as provided for by the terms of AFRL Contract # FA9453-07-C-0178" with -- This invention was made with Government support under AFRL Contract # FA9453-07-C-0178 awarded by the U.S. Air Force Research Laboratory. The Government has certain rights in the invention. --

Signed and Sealed this
Fourteenth Day of October, 2014

Michelle K. Lee
*Deputy Director of the United States Patent and Trademark Office*